(12) United States Patent
Cheng et al.

(10) Patent No.: US 10,170,364 B2
(45) Date of Patent: Jan. 1, 2019

(54) STRESS MEMORIZATION TECHNIQUE FOR STRAIN COUPLING ENHANCEMENT IN BULK FINFET DEVICE

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 15/840,344

(22) Filed: Dec. 13, 2017

(65) Prior Publication Data

US 2018/0102290 A1   Apr. 12, 2018

Related U.S. Application Data

(63) Continuation of application No. 15/467,123, filed on Mar. 23, 2017, now Pat. No. 9,892,973, which is a
(Continued)

(51) Int. Cl.
*H01L 21/338* (2006.01)
*H01L 21/8234* (2006.01)
(Continued)

(52) U.S. Cl.
CPC .... *H01L 21/823412* (2013.01); *H01L 21/265* (2013.01); *H01L 21/3085* (2013.01);
(Continued)

(58) Field of Classification Search
CPC .......... H01L 21/823412; H01L 21/265; H01L 29/7849; H01L 21/30604; H01L 29/66795;
(Continued)

(56) References Cited

U.S. PATENT DOCUMENTS 6,180,476 B1 *  1/2001  Yu ..................... H01L 21/26506
                                                              438/305
7,141,856 B2   11/2006  Lee et al.
(Continued)

OTHER PUBLICATIONS

US 8,508,000, 08/2013, Chang et al. (withdrawn)
(Continued)

*Primary Examiner* — Thinh T Nguyen
(74) *Attorney, Agent, or Firm* — Tutunjian & Bitetto, P.C.; Vazken Alexanian

(57) ABSTRACT

A method for forming strained fins includes etching trenches in a bulk substrate to form fins, filling the trenches with a dielectric fill and recessing the dielectric fill into the trenches to form shallow trench isolation regions. The fins are etched above the shallow trench isolation regions to form a staircase fin structure with narrow top portions of the fins. Gate structures are formed over the top portions of the fins. Raised source ad drain regions are epitaxially grown on opposite sides of the gate structure. A pre-morphization implant is performed to generate defects in the substrate to couple strain into the top portions of the fins.

10 Claims, 10 Drawing Sheets

A-A

Related U.S. Application Data continuation of application No. 15/224,128, filed on Jul. 29, 2016, now Pat. No. 9,660,077, which is a continuation of application No. 14/858,871, filed on Sep. 18, 2015, now Pat. No. 9,431,521.

(51) Int. Cl.

| | |
|---|---|
| *H01L 29/66* | (2006.01) |
| *H01L 29/10* | (2006.01) |
| *H01L 29/78* | (2006.01) |
| *H01L 21/762* | (2006.01) |
| *H01L 21/265* | (2006.01) |
| *H01L 21/324* | (2006.01) |
| *H01L 29/06* | (2006.01) |
| *H01L 29/08* | (2006.01) |
| *H01L 21/306* | (2006.01) |
| *H01L 21/308* | (2006.01) |
| *H01L 27/088* | (2006.01) |
| *H01L 27/092* | (2006.01) |
| *H01L 21/84* | (2006.01) |

(52) U.S. Cl.
CPC ...... *H01L 21/30604* (2013.01); *H01L 21/324* (2013.01); *H01L 21/76205* (2013.01); *H01L 21/76224* (2013.01); *H01L 21/76237* (2013.01); *H01L 21/823431* (2013.01); *H01L 21/823481* (2013.01); *H01L 29/0649* (2013.01); *H01L 29/0653* (2013.01); *H01L 29/0847* (2013.01); *H01L 29/1054* (2013.01); *H01L 29/6656* (2013.01); *H01L 29/66795* (2013.01); *H01L 29/66818* (2013.01); *H01L 29/785* (2013.01); *H01L 29/7847* (2013.01); *H01L 29/7849* (2013.01); *H01L 29/7851* (2013.01); *H01L 21/26506* (2013.01); *H01L 21/84* (2013.01); *H01L 27/0886* (2013.01); *H01L 27/0924* (2013.01); *H01L 29/1045* (2013.01); *H01L 29/7848* (2013.01)

(58) Field of Classification Search
CPC ............. H01L 29/6656; H01L 29/1054; H01L 29/0649; H01L 21/823481; H01L 21/823431; H01L 21/76224; H01L 21/3085; H01L 29/785; H01L 29/7848
USPC ......... 438/174, 83, 151, 284, 285, 286, 276, 438/194, 197; 257/401, 287, 288, 257/E21.703, E27.014
See application file for complete search history.

(56) References Cited

U.S. PATENT DOCUMENTS

| | | | |
|---|---|---|---|
| 7,341,902 | B2 | 3/2008 | Anderson et al. |
| 8,022,478 | B2 | 9/2011 | Anderson et al. |
| 8,551,845 | B2 | 10/2013 | Chan et al. |
| 8,697,523 | B2 | 4/2014 | Cai et al. |
| 8,716,786 | B2 | 5/2014 | Baumgartner et al. |
| 2004/0238897 | A1 | 12/2004 | Oishi |
| 2006/0170066 | A1 | 8/2006 | Mathew et al. |
| 2012/0068193 | A1 | 3/2012 | Chan et al. |
| 2013/0093026 | A1 | 4/2013 | Wann et al. |
| 2013/0178020 | A1 | 7/2013 | Cai et al. |
| 2013/0200455 | A1 | 8/2013 | Lo et al. |
| 2013/0200468 | A1 | 8/2013 | Cai et al. |

OTHER PUBLICATIONS

List of IBM Patents or Patent Applications Treated as Related dated Dec. 13, 2017, 2 pages.
Office Action issued in U.S. Appl. No. 15/223,937 dated Jan. 18, 2017, pp. 1-8.
U.S. Office Action issued in U.S. Appl. No. 15/686,745 dated Mar. 9, 2018, 11 pages.

\* cited by examiner

US 10,170,364 B2

STRESS MEMORIZATION TECHNIQUE FOR STRAIN COUPLING ENHANCEMENT IN BULK FINFET DEVICE

BACKGROUND

Technical Field

The present invention relates to semiconductor devices and processing, and more particularly to a staircase fin field effect transistor (finFET) that preserves channel region strain.

Description of the Related Art

A stress memorization technique (SMT) has demonstrated a drive current benefit on planar device structures for n-type field effect transistors (NFETs). In finFET devices however, due to the nature of the three-dimensional geometrical constraint, the implementation of SMT has become even more challenging. The fins tend to be isolated from larger bulk semiconductor materials, and their small size makes it very difficult to sustain strain in the fins.

SUMMARY

A method for forming strained fins includes etching trenches in a bulk substrate to form fins, filling the trenches with a dielectric fill and recessing the dielectric fill into the trenches to form shallow trench isolation regions. The fins are etched above the shallow trench isolation regions to form a staircase fin structure with narrow top portions of the fins. Gate structures are formed over the top portions of the fins. Raised source ad drain regions are epitaxially grown on opposite sides of the gate structure. A pre-amorphization implant is performed to generate defects in the substrate to couple strain into the top portions of the fins.

Another method for forming strained fins includes forming a first dielectric layer on a bulk substrate; forming a second dielectric layer on the first dielectric layer; forming mandrels with sidewall spacers; removing the mandrels; etching the second dielectric layer and the first dielectric layer in accordance with the sidewall spacers to form an etch mask; etching trenches in the bulk substrate to form fins using the etch mask; filling the trenches with a dielectric fill; recessing the dielectric fill into the trenches to form shallow trench isolation regions; etching the fins above the shallow trench isolation regions to form a staircase fin structure with narrow top portions of the fins; forming gate structures over the top portions of the fins; epitaxially growing raised source ad drain regions on opposite sides of the gate structure; performing a pre-amorphization implant to generate defects in the substrate to induce strain and couple the strain into the top portions of the fins; and performing a stress memorization technique (SMT) anneal to propagate the strain after the pre-amorphization implant through the fins from the substrate.

A semiconductor device includes a bulk substrate having staircase fin structures including a larger base portion below a shallow trench isolation region and a narrower top portion above the shallow trench isolation region. A defect is introduced into the substrate by a pre-amorphization implant to couple strain into the top portion of the fins. A gate structure is formed transversely over the top portion of the fins, and source and drain regions are formed on the top portion of the fins on opposite sides of the gate structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
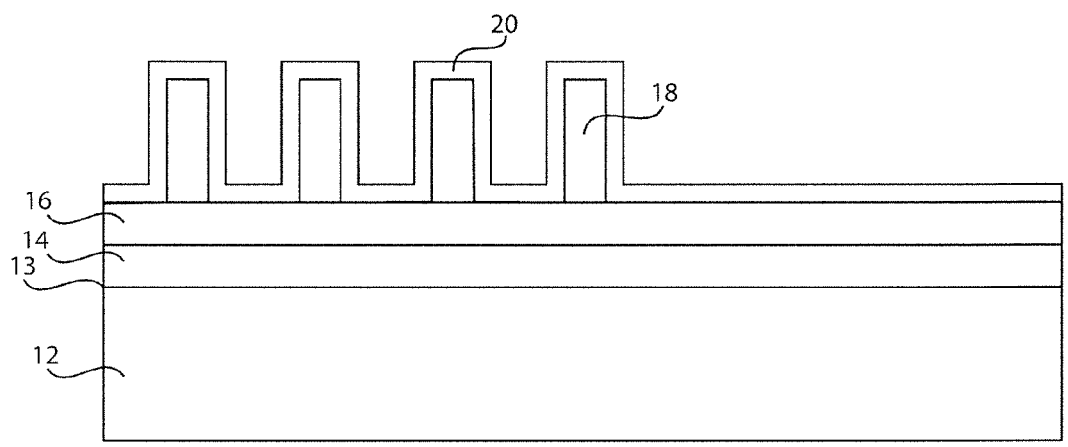
FIG. 1 is a cross-sectional view of a partially fabricated semiconductor device having mandrels and a spacer layer formed on the mandrels for forming an etch mask in accordance with the present principles.

In accordance with the present principles, staircase fin structures and methods for fabricating these structures are provided. In one embodiment, the structure includes a staircase fin structure to enhance strain coupling. An enlarged area along a longitudinal direction of the fin facilitates the coupling of shear strain generated by a dislocation located at a bottom portion of the fin (beneath shallow trench isolation (STI)).

In useful embodiments, a bulk semiconductor substrate is employed to faun staircase fins. Fins are patterned using a first mask, followed by a masking of the base of the fin. Then, an additional etch is performed to reduce the thickness of the fin on a top portion. While the fin on the top portion remains thin, the stress/strain from the substrate remains since the fin is integrally formed in or with the substrate.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is shown in accordance with the present principles. The device 10 includes a bulk substrate 12, preferably monocrystalline Si although other substrate materials may be employed. The bulk substrate 12 is patterned and etched to form fins therein. The fin patterning process may include a direct lithographic patterning process or a spacer imaging transfer (SIT) patterning process to etch portions of the substrate 12. The present embodiment employs a SIT process.

The substrate 12 may include a pad (oxide) layer 13, which is a relatively thin oxide formed on the substrate 12. A first dielectric layer 14 is formed on the pad layer 13. In one embodiment, the first dielectric layer 14 includes a nitride. The first dielectric layer 16 may include a thickness of about 40 nm. A second dielectric layer 16 is deposited on the first dielectric layer 14. The second dielectric layer 16 may include an undoped silicate glass (USG) layer or the like. The second dielectric layer 16 may include a thickness of about 30 nm.

Mandrels 18 are formed on the second dielectric layer 16 by depositing a sacrificial layer and patterning the sacrificial layer in accordance with a lithographic mask (not shown) using a reactive ion etch (RIE) process. The sacrificial layer may include amorphous silicon to form mandrels 18. A conformal layer 20 is deposited over the mandrels 18. The conformal layer 20 may include an oxide deposition employed for forming a spacer image transfer (SIT) spacer 22 in FIG. 2.

Figure 2:
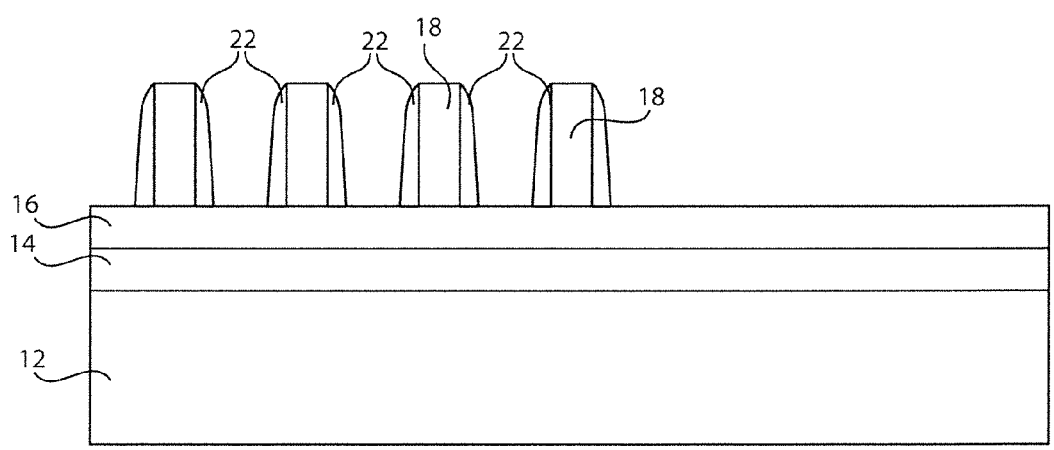
FIG. 2 is a cross-sectional view of the semiconductor device of FIG. 1 having sidewall spacers formed on the mandrels for forming the etch mask in accordance with the present principles.

Referring to FIG. 2, a SIT spacer etch is performed on the conformal layer 20 to form spacers 22 on the mandrels 18. The spacers 22 may provide a fin pitch of, e.g., about 42 nm with spacer thickness after pull down of the mandrels 18 being controlled at about 10 nm. Other pitches and spacer thicknesses are also contemplated. The etch stops on the second dielectric layer 16 (e.g., the USG film) above the second dielectric layer 14.

Figure 3:
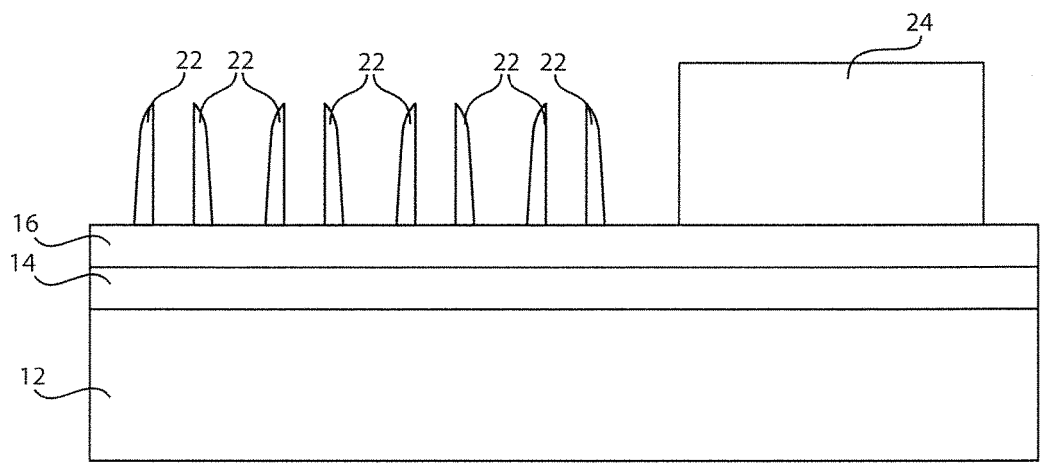
FIG. 3 is a cross-sectional view of the semiconductor device of FIG. 2 having the mandrels removed leaving the sidewall spacers in accordance with the present principles.

Referring to FIG. 3, the mandrels 18 are removed (mandrel pull) by a selective etch process to remove the mandrels with respect to the spacers 22 and the second dielectric layer 16. An organic dielectric layer (ODL) 24 is deposited and patterned to keep areas without fins intact during the subsequent processing.

Figure 4:
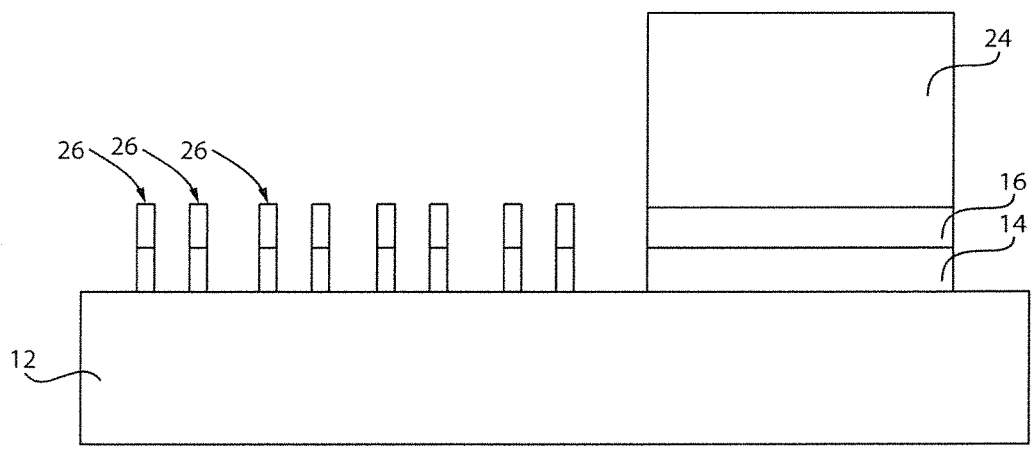
FIG. 4 is a cross-sectional view of the semiconductor device of FIG. 3 having dielectric layers etched in accordance with the spacers to form the etch mask for etching a bulk substrate in accordance with the present principles.

Referring to FIG. 4, a RIE is performed to etch the layers 14 and 16 to form a mask pattern 26 for etching fins into the substrate 12. A lithographic mask may be employed to protect the ODL 24 during the RIE. In another embodiment, the ODL 24 is made thick enough to withstand the RIE.

Figure 5:
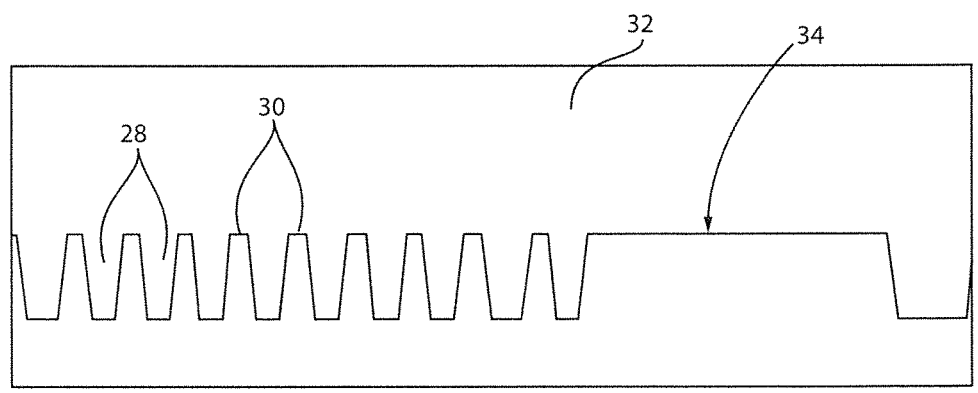
FIG. 5 is a cross-sectional view of the semiconductor device of FIG. 4 having trenches etched in the substrate and filled with a dielectric fill in accordance with the present principles.

Referring to FIG. 5, another RIE process is performed to carry the pattern 26 into the substrate 12 to etch trenches 28 to form fins 30. In one example, a targeted depth of the fin RIE is about 100 nm from the top of the fin 30.

The ODL 24 protects an area 34 where no fins are formed. Area 34 may be employed for forming planar devices such as electrostatic discharge (ESD) devices, passive devices or the like. After the fin etch, area 34 is exposed by removing the ODL 24 and layers 14 and 16. A dielectric fill 32 is deposited to form a shallow trench isolation (STI) to fill the trenches 28 and cover the substrate 12. The dielectric fill 32 may include a high aspect ratio process (HARP) oxide 32 (TEOS), although other materials and processes may be employed.

Figure 6:
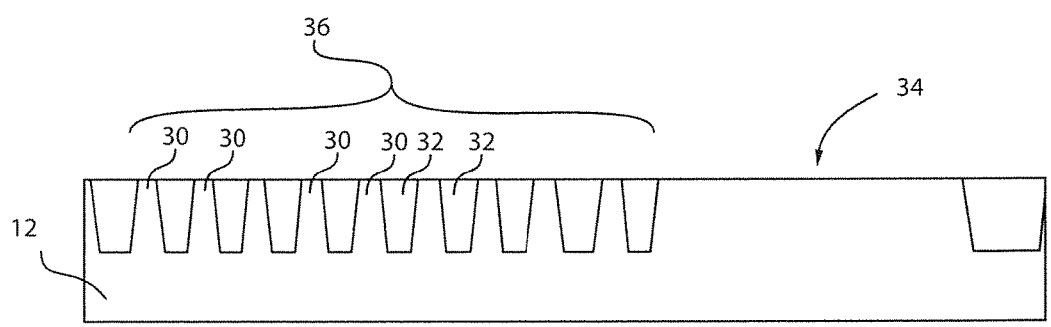
FIG. 6 is a cross-sectional view of the semiconductor device of FIG. 5 having the dielectric fill planarized to a top of the substrate in accordance with the present principles.

Referring to FIG. 6, the dielectric fill 32 is etched back followed by a chemical mechanical polish (CMP). This brings the level of the dielectric fill 32 down to tops of the fins 30. The fins 30 are formed in a fin region 36 employed for forming fin field effect transistors (finFETs).

Figure 7:
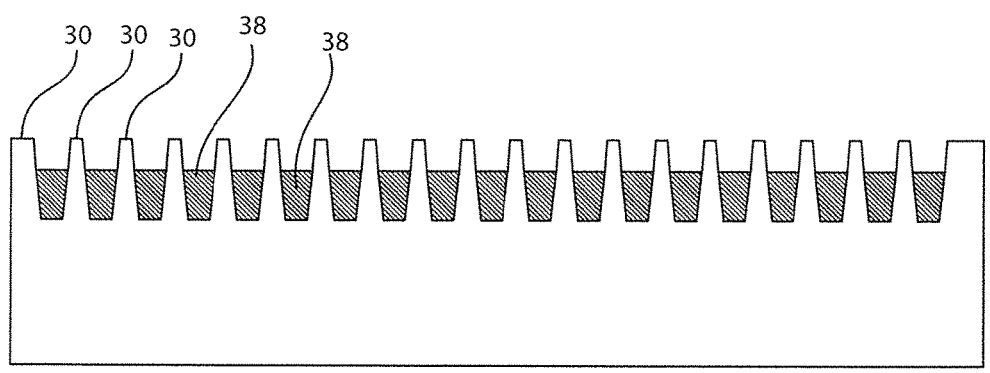
FIG. 7 is a cross-sectional view of the semiconductor device of FIG. 6 having the dielectric fill recessed into the trenches to form shallow trench isolation (STI) regions in accordance with the present principles.

Referring to FIG. 7, a cross-sectional view of the fin region 36 is shown. For simplicity, the fin region 36 shows either an n-type field effect transistor (NFET) region or a p-type field effect transistor (PFET) region. An STI recess process is performed to further recess the dielectric fill 32 to form STI regions 38. In one embodiment, the recess of dielectric fill 32 is performed using, e.g., a SiCoNi etching chemistry.

Figure 8:
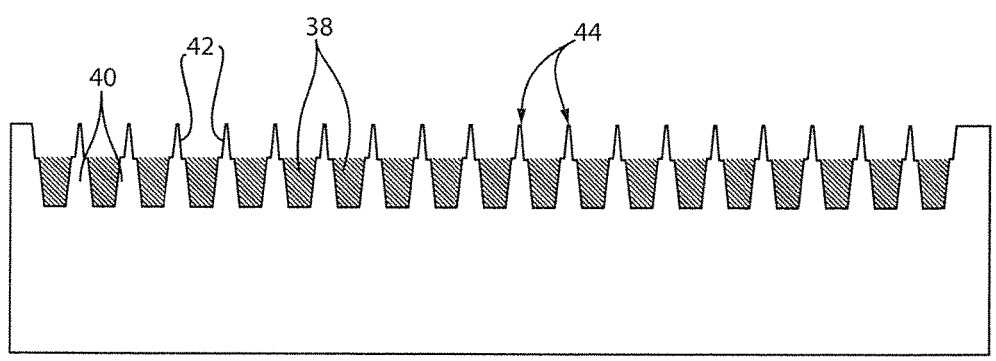
FIG. 8 is a cross-sectional view of the semiconductor device of FIG. 7 having tops of fins etched to form staircase fin structures in accordance with the present principles.

Referring to FIG. 8, fin portions 40 below the STI regions 38 are protected from a fin trimming process. Fin portions 42 above the STI regions 38 are subjected to a controlled oxidation followed by a HF wet strip to reduce the size of the portion 42 with respect to portion 40. This forms a staircase structure 44 for the fins with the broader base fin portions 40 and the narrower top fin portions 42.

Figure 9:
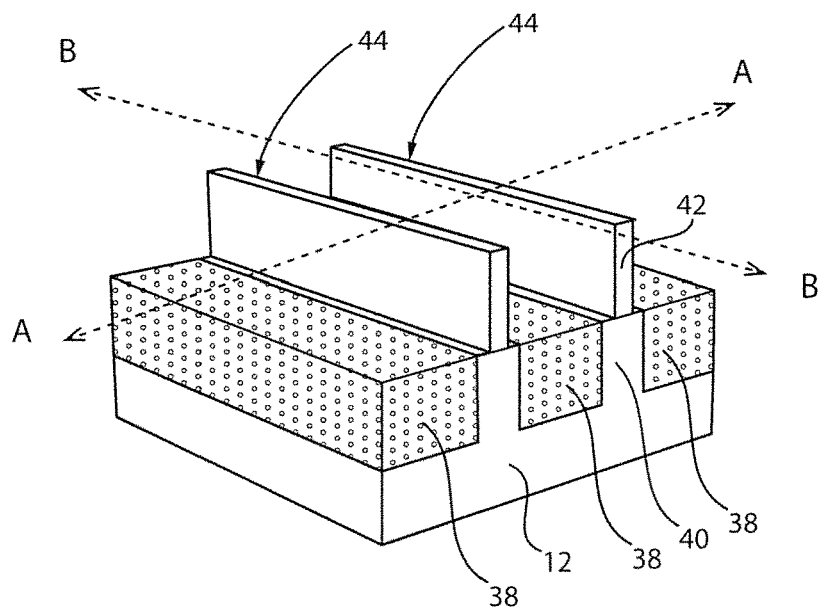
FIG. 9 is a perspective view showing a staircase structure with STI regions in accordance with one illustrative embodiment.

Referring to FIG. 9, a perspective view of a staircase structure 44 with STI regions 38 is shown in accordance with one illustrative embodiment. The perspective view includes section lines A-A and B-B, which provide cross-sections as depicted in FIGS. 10 and 11, respectively.

Figure 10:
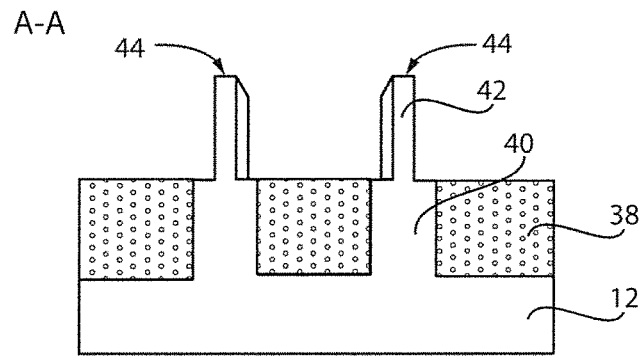
FIG. 10 is a cross-sectional view taken at section line A-A of FIG. 9 showing the staircase structure with STI regions in accordance with one illustrative embodiment.
Figure 11:
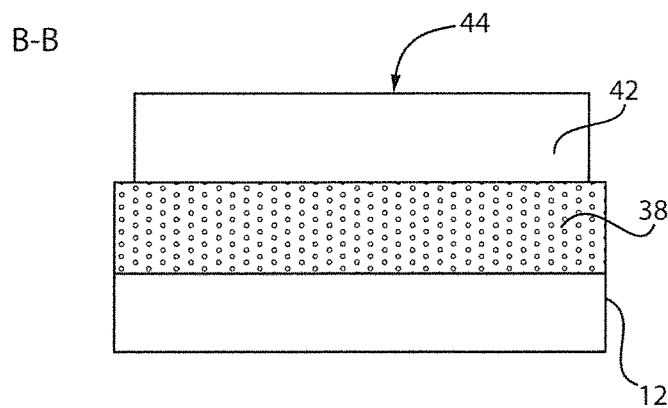
FIG. 11 is a cross-sectional view taken at section line B-B of FIG. 9 showing the staircase structure with STI regions in accordance with one illustrative embodiment.

Referring to FIGS. 10 and 11, cross-sectional views taken at section lines A-A and B-B, respectively in FIG. 9 are illustratively shown. The staircase structure 44 includes the base portion 40 and the top portion 42. In one embodiment, the base portion 40 includes a height of about 50 nm above the etched top of the substrate 12. The top portion 42 may include a thickness of about 10 nm and a height of about 30 nm. The base portion 40 may include a thickness of between about 12 nm to about 20 nm. A distance (pitch) between two top portions 42 may be about 32 nm. Other dimensions may also be employed. A transition between the base portion 40 and the top portion 42 may be abrupt, forming a step between the portions 40 and 42.

Figure 12:
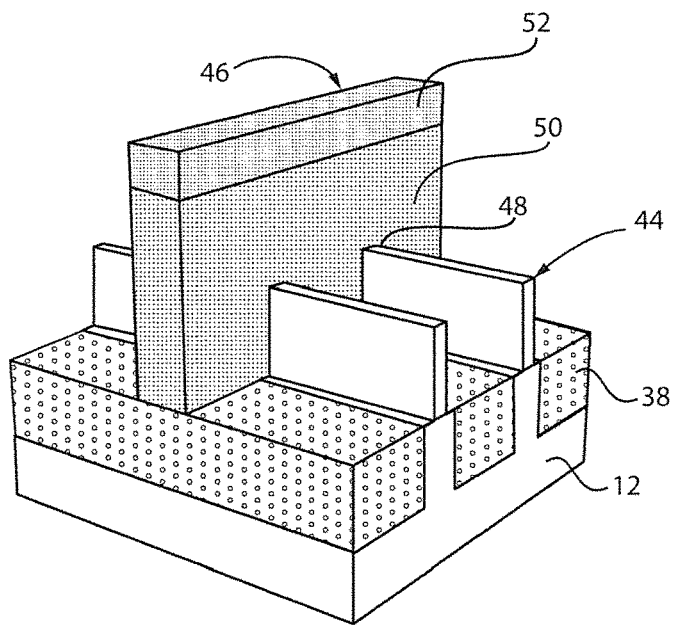
FIG. 12 is a perspective view showing a gate structure formed over the staircase structure in accordance with one illustrative embodiment.
Figure 13:
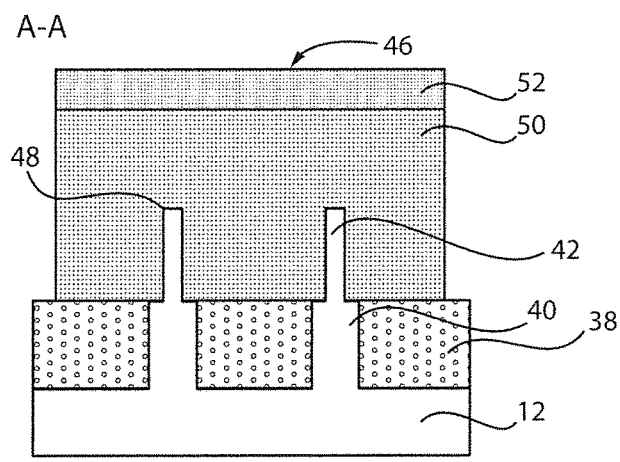
FIG. 13 is a cross-sectional view taken at section line A-A of FIG. 9 showing the gate structure of FIG. 12 in accordance with one illustrative embodiment.
Figure 14:
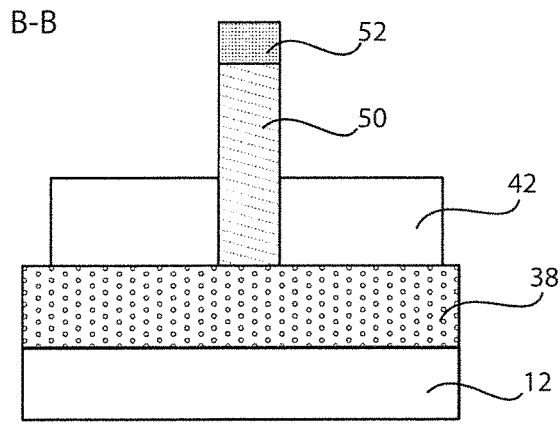
FIG. 14 is a cross-sectional view taken at section line B-B of FIG. 9 showing the gate structure of FIG. 12 in accordance with one illustrative embodiment.

Referring to FIG. 12, a perspective view of the staircase structure 44 with STI regions 38 is shown having a gate structure 46 formed thereon in accordance with illustrative embodiments. The perspective view uses section lines A-A and B-B of FIG. 9, to provide cross-sectional views as depicted in FIGS. 13 and 14, respectively. The gate structure 46 is formed by depositing a gate dielectric 48 and a dummy gate/gate conductor 50. The dummy gate 50 may include amorphous silicon or the gate conductor may include a metal material. The dummy gate/gate conductor 50 may be planarized and annealed. The planarization process may include a CMP process, and the anneal may include a rapid thermal anneal at about 800 degrees C. for about 5 seconds. A hardmask 52 is deposited on the dummy gate/gate conductor 50 and may include SiN. The hardmask 52 may be patterned using a lithographic process, and the hardmask 52 will be employed to etch the dummy gate/gate conductor 50 and the gate dielectric 48 to form the gate structure 46 by a stack etch.

Referring to FIGS. 13 and 14, cross-sectional views taken at section lines A-A and B-B (FIG. 9), respectively from FIG. 12 are illustratively shown. The staircase structure 44 includes the gate structure 46 transversely disposed relative to the base portion 40 and the top portion 42.

Figure 15:
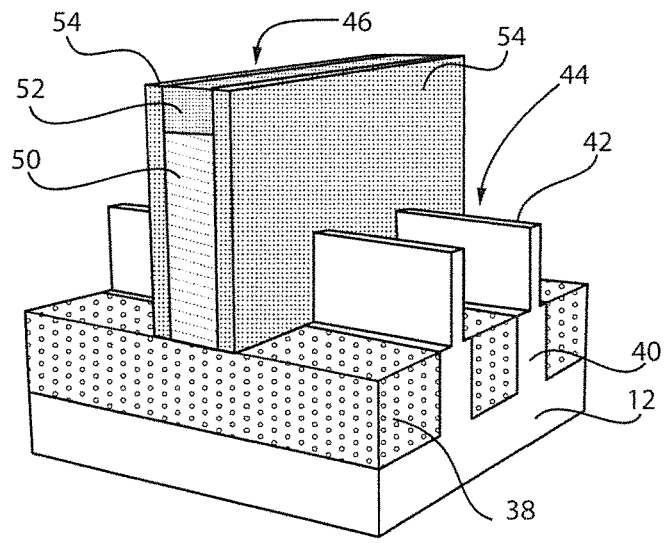
FIG. 15 is a perspective view showing the gate structure having spacers formed thereon in accordance with one illustrative embodiment.

Referring to FIG. 15, a perspective view of the gate structure 46 is shown having sidewall spacers 54 formed thereon in accordance with the illustrative embodiment. The perspective view uses section lines A-A and B-B of FIG. 9, to provide cross-sectional views as depicted in FIGS. 16 and 17, respectively.

A dielectric spacer layer is deposited. In useful embodiments, a SiN material or SiBCN material may be employed in a low-k spacer deposition. The spacer layer is etched (e.g., RIE) to remove material from horizontal surfaces and fin portions 42 to form spacers 54.

Figure 16:
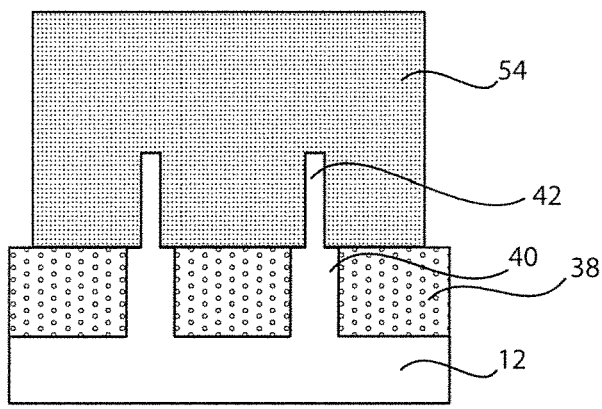
FIG. 16 is a cross-sectional view taken at section line A-A of FIG. 9 showing the gate structure of FIG. 15 with spacers in accordance with one illustrative embodiment.
Figure 17:
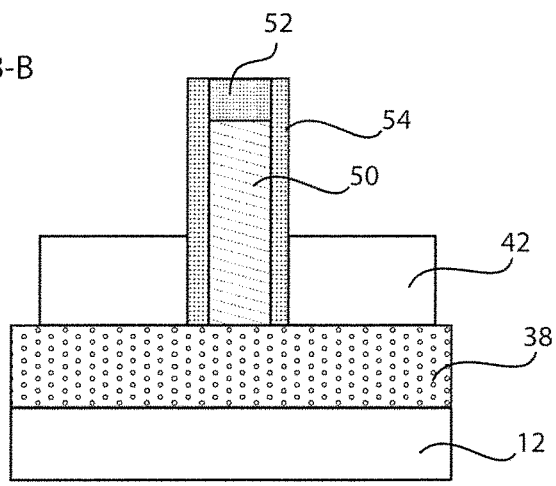
FIG. 17 is a cross-sectional view taken at section line B-B of FIG. 9 showing the gate structure of FIG. 15 with spacers in accordance with one illustrative embodiment.

Referring to FIGS. 16 and 17, cross-sectional views taken at section lines A-A and B-B (FIG. 9), respectively from FIG. 15 are illustratively shown. The gate structure 46 shows spacers 54 formed on the sidewalls thereof.

Figure 18:
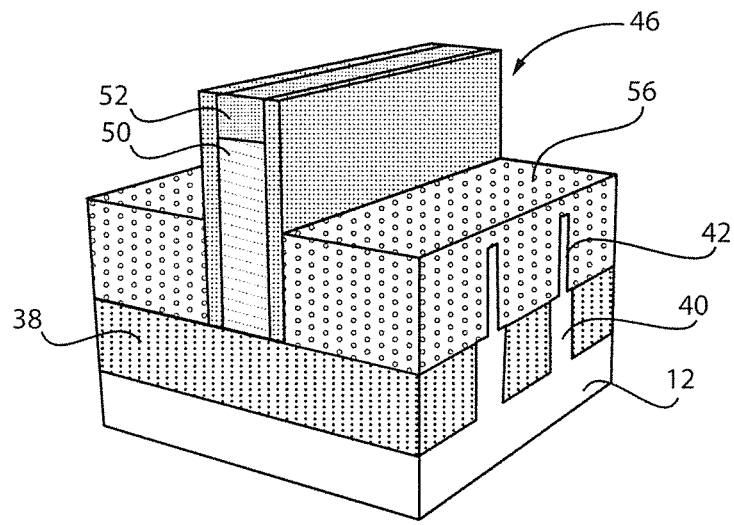
FIG. 18 is a perspective view showing raised source and drain regions formed in accordance with one illustrative embodiment.

Referring to FIG. 18, a perspective view shows raised source and drain (RSD) regions 56 formed on the top portions 42 of the staircase fin structures 44 in accordance with the illustrative embodiment. The perspective view uses section lines A-A and B-B of FIG. 9, to provide cross-sectional views as depicted in FIGS. 16 and 17, respectively. RSD regions 56 are epitaxially grown and merged to form a junction and provide a template for a following stress memorization technique (SMT) process.

Figure 19:
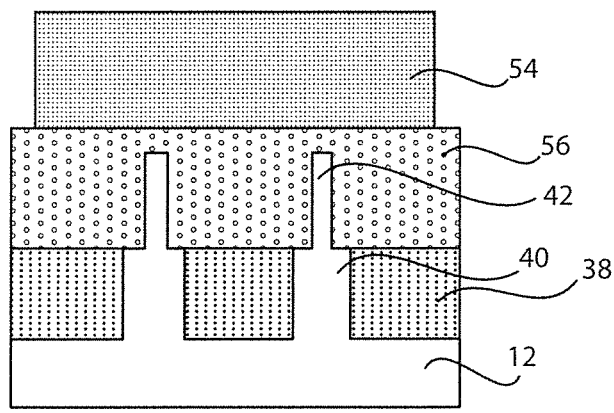
FIG. 19 is a cross-sectional view taken at section line A-A of FIG. 9 showing the raised source and drain regions of FIG. 18 in accordance with one illustrative embodiment.
Figure 20:
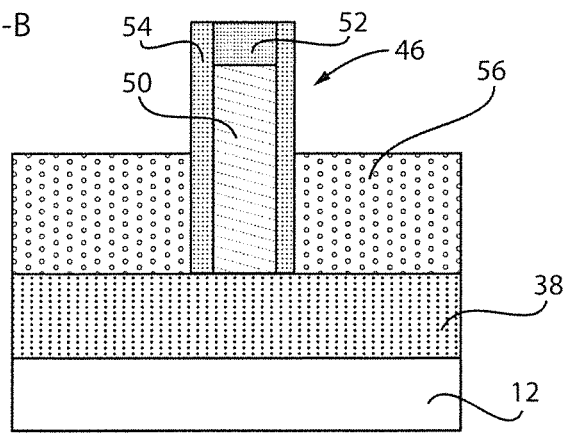
FIG. 20 is a cross-sectional view taken at section line B-B of FIG. 9 showing the raised source and drain regions of FIG. 18 in accordance with one illustrative embodiment.

Referring to FIGS. 19 and 20, cross-sectional views taken at section lines A-A and B-B (FIG. 9), respectively from FIG. 18 are illustratively shown.

Figure 21:
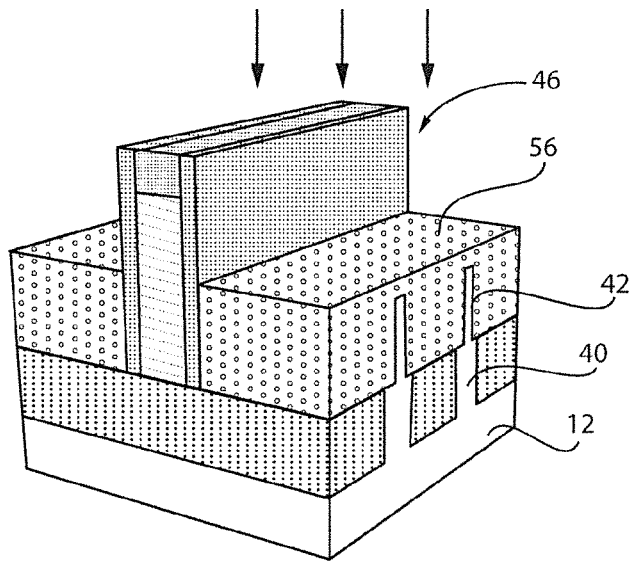
FIG. 21 is a perspective view showing defects implanted in the substrate in accordance with one illustrative embodiment.
Figure 22:
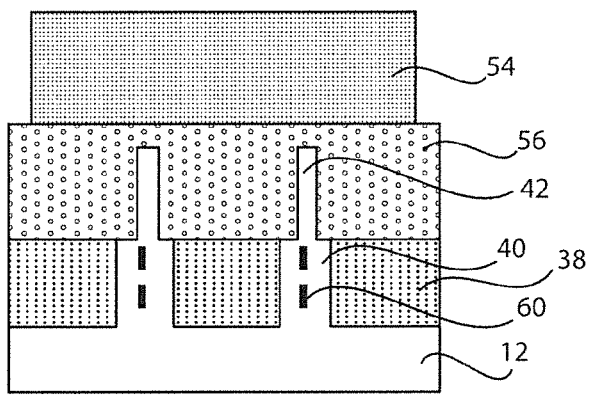
FIG. 22 is a cross-sectional view taken at section line A-A of FIG. 9 showing defects implanted in the substrate of FIG. 21 in accordance with one illustrative embodiment.
Figure 23:
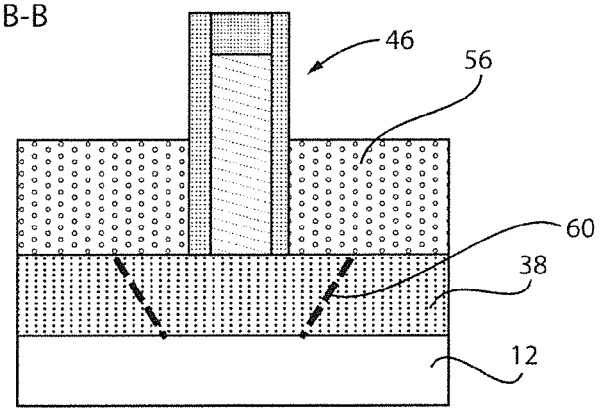
FIG. 23 is a cross-sectional view taken at section line B-B of FIG. 9 showing defects implanted in the substrate of FIG. 21 in accordance with one illustrative embodiment.

Referring to FIG. 21, a perspective view shows raised source and drain (RSD) regions 56 formed on the top portions 42 of the staircase fin structures 44 in accordance with the illustrative embodiment. The perspective view uses section lines A-A and B-B of FIG. 9, to provide cross-sectional views as depicted in FIGS. 22 and 23, respectively.

A pre-amorphization implant (PAI) process is performed to implant species into the substrate 12. The PAI process may include employing inert materials, e.g., noble gases, such as Ar, He or the like to cause defects 60 in the substrate 12 below the STI 38. In a particularly useful embodiment, the PAI process may employ heavy ion implantation, such as, e.g., Ge or Xe, with a dosage in the range of about $1\times10^{14}/cm^2$ to about $5\times10^{14}$ at 50-100 keV.

The defects 60 generated beneath the STI 38 provide strain. A SMT anneal may be performed to induce the strain in the crystal of the substrate 12. In one embodiment, the anneal is in the $N_2$ ambient at a temperature between about 500 and about 700 degrees C. for 10-20 minutes. Due to the enlarged fin area in the substrate 12 and carried through the base portion 40, the strain coupling is enhanced. Performance benefits are gained due to the strained fin portion 42.

Figure 24:
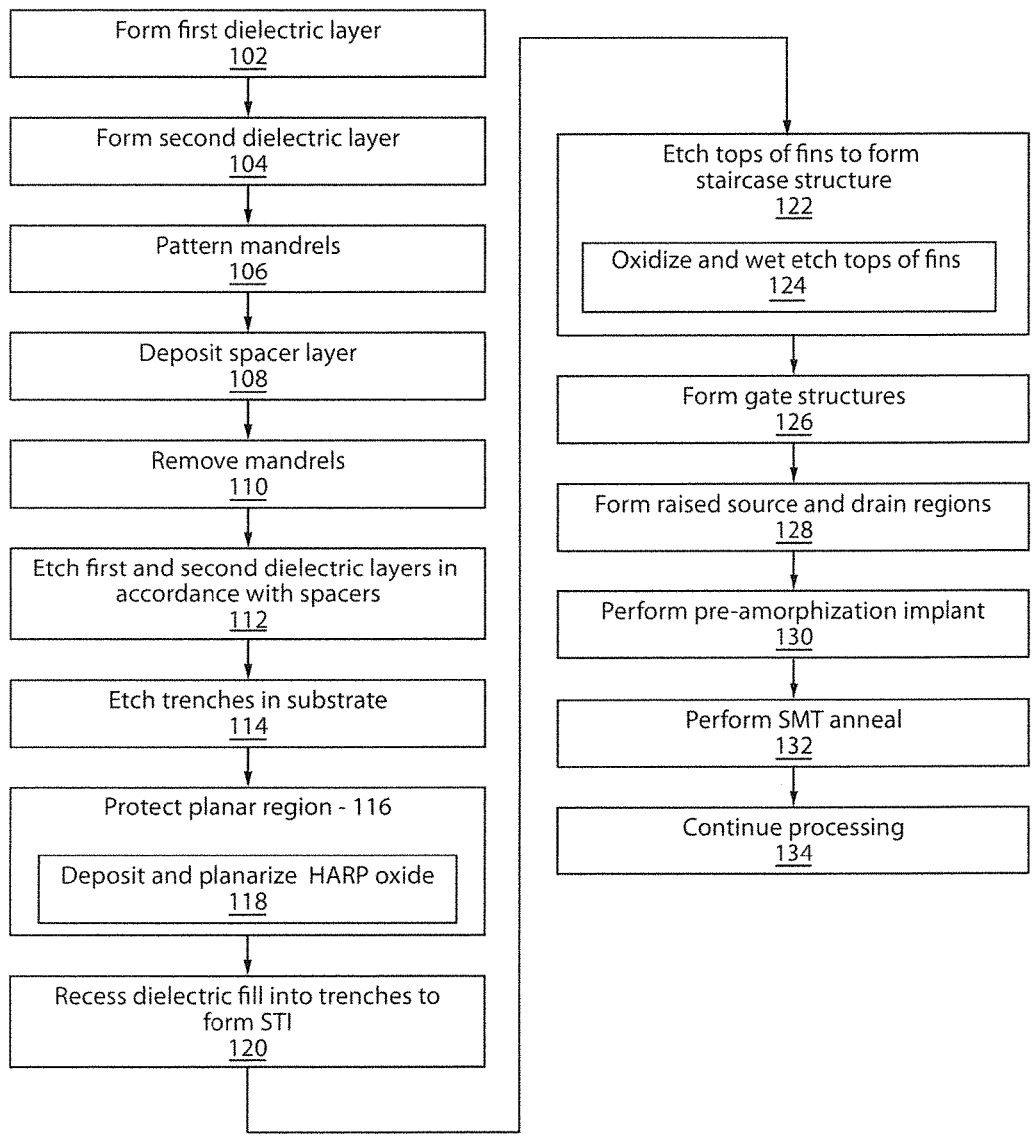
FIG. 24 is a block/flow diagram showing a method for forming strained fins in accordance with illustrative embodiments.

Referring to FIG. 24, a method for forming strained fins is shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a first dielectric layer is formed on a bulk substrate. The first dielectric layer may be formed on a pad oxide layer formed on the bulk substrate. The first dielectric layer may include a nitride material. In block 104, a second dielectric layer is formed on the first dielectric layer. In block 106, mandrels are patterned. In block 108, a spacer layer is deposited over the mandrels and etched to formed sidewall spacers. In block 110, the mandrels are selectively removed. In block 112, the second dielectric layer and the first dielectric layer are etched in accordance with the sidewall spacers to form an etch mask.

In block 114, trenches are etched in the bulk substrate to form fins using the etch mask. In block 115, a planar region is protected, e.g., for planar devices. The planar region may be protected using an ODL or other material.

In block 116, the trenches are filled with a dielectric fill. The dielectric fill may include depositing a high aspect ratio process (HARP) oxide into the trenches and over the substrate and planarizing the HARP oxide to a top of the fins in block 118. In block 120, the dielectric fill is recessed into the trenches to form shallow trench isolation regions. The dielectric fill may be recessed using a SiCoNi etch chemistry, although other etchants may be employed.

In block 122, the fins are etched above the shallow trench isolation regions to form a staircase fin structure with narrow top portions of the fins. The etching of the fins above the shallow trench isolation regions may include oxidizing the fins above the shallow trench isolation regions, and wet etching the fins above the shallow trench isolation regions in block 124.

In block 126, gate structures are formed over the top portions of the fins. In block 128, raised source and drain regions are epitaxially grown on opposite sides of the gate structure. In block 130, a pre-amorphization implant is performed to generate defects in the substrate to induce strain and couple the strain into the top portions of the fins. The pre-amorphization implant may include implanting inert species into the substrate to cause the defects. The inert species may include nobel gases.

In block 132, a stress memorization technique (SMT) anneal is performed to propagate the strain after the pre-amorphization implant through the fins from the substrate. In block 134, processing continues with the formation of additional structures and components. For example, contacts, interlevel dielectric materials, metallizations, etc.

Having described preferred embodiments stress memorization technique for strain coupling enhancement in bulk finFET device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming strained fins, comprising:
   forming a staircase fin structure in a substrate with narrow top portions for fins;
   epitaxially growing raised source and drain regions over the fins; and
   performing a pre-amorphization implant to generate defects in the substrate to induce strain and to couple the strain into the top portions of the fins.

2. The method as recited in claim 1, further comprising performing a stress memorization technique (SMT) anneal to propagate the strain after the pre-amorphization implant.

3. The method as recited in claim 1, further comprising:
   forming mandrels;
   forming spacers on the mandrels to form an etch mask for etching trenches in the substrate; and
   etching the trenches in the substrate, using the etch mask, to form the fins.

4. The method as recited in claim 1, further comprising:
   depositing a high aspect ratio process (HARP) oxide into trenches etched into the substrate between the fins; and
   planarizing the HARP oxide to a top of the fins.

5. The method as recited in claim 1, wherein forming the fins includes:
   oxidizing the fins above shallow trench isolation regions; and
   wet etching the fins above the shallow trench isolation regions.

6. The method as recited in claim 1, wherein performing the pre-amorphization implant includes implanting ion species into the substrate to cause the defects.

7. The method as recited in claim 6, wherein the ion species include Ge or Xe.

8. The method as recited in claim 1, further comprising protecting a planar region from processing for planar devices.

9. The method as recited in claim 1, further comprising recessing a dielectric fill into trenches between the fins.

10. The method as recited in claim 9, wherein the recessing the dielectric fill includes recessing the dielectric fill using a SiCoNi etch chemistry.

\* \* \* \* \*